US008859352B2

(12) United States Patent
Mao et al.

(10) Patent No.: US 8,859,352 B2
(45) Date of Patent: Oct. 14, 2014

(54) LIGHTLY-DOPED DRAINS (LDD) OF IMAGE SENSOR TRANSISTORS USING SELECTIVE EPITAXY

(75) Inventors: Duli Mao, Sunnyvale, CA (US); Hsin-Chih Tai, Cupertino, CA (US); Howard E. Rhodes, San Martin, CA (US); Vincent Venezia, Sunnyvale, CA (US); Yin Qian, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 285 days.

(21) Appl. No.: 13/559,467

(22) Filed: Jul. 26, 2012

(65) Prior Publication Data

US 2012/0295385 A1    Nov. 22, 2012

Related U.S. Application Data

(62) Division of application No. 12/274,275, filed on Nov. 19, 2008, now Pat. No. 8,253,200.

(51) Int. Cl.
*H01L 21/00* (2006.01)
*H01L 29/66* (2006.01)
*H01L 27/146* (2006.01)

(52) U.S. Cl.
CPC ....... *H01L 27/14609* (2013.01); *H01L 29/6659* (2013.01); *H01L 27/14643* (2013.01); *H01L 27/14689* (2013.01); *H01L 29/66636* (2013.01)
USPC ............ 438/163; 438/542; 438/481; 438/413

(58) Field of Classification Search
USPC .................. 438/163, 542, 481, 413
See application file for complete search history.

(56) References Cited

U.S. PATENT DOCUMENTS

| | | | |
|---|---|---|---|
| 6,046,484 A | 4/2000 | Kodaira | |
| 6,274,894 B1 | 8/2001 | Wieczorek et al. | |
| 6,323,561 B1 | 11/2001 | Gardner et al. | |
| 6,847,051 B2 | 1/2005 | Hong | |
| 6,940,137 B2 | 9/2005 | Chen et al. | |
| 7,078,742 B2 | 7/2006 | Lin et al. | |
| 7,189,603 B2 * | 3/2007 | Hotta | 438/149 |
| 7,314,804 B2 | 1/2008 | Lindert et al. | |
| 7,528,045 B2 * | 5/2009 | Wu et al. | 438/296 |

(Continued)

FOREIGN PATENT DOCUMENTS

| | | |
|---|---|---|
| CN | 101281926 (A) | 10/2008 |
| TW | 479269 (B) | 3/2002 |
| TW | 550831 (B) | 1/2003 |
| TW | 200605341 | 2/2006 |

OTHER PUBLICATIONS

TW 098139156—Taiwan Office Action and Search Report, dated Jul. 10, 2013, 6 pages.

*Primary Examiner* — Eugene Lee
(74) *Attorney, Agent, or Firm* — Blakely Sokoloff Taylor & Zafman LLP

(57) ABSTRACT

Embodiments of the present invention are directed to an image sensor having pixel transistors and peripheral transistors disposed in a silicon substrate. For some embodiments, a protective coating is disposed on the peripheral transistors and doped silicon is epitaxially grown on the substrate to form lightly-doped drain (LDD) areas for the pixel transistors. The protective oxide may be used to prevent epitaxial growth of silicon on the peripheral transistors during formation of the LDD areas of the pixel transistors.

15 Claims, 5 Drawing Sheets

(56) References Cited

U.S. PATENT DOCUMENTS

| | | |
|---|---|---|
| 7,544,997 B2 | 6/2009 | Zhang et al. |
| 7,554,110 B2 | 6/2009 | Yu et al. |
| 7,642,107 B2 | 1/2010 | Ladd |
| 7,691,663 B2 * | 4/2010 | Lee ................................. 438/87 |
| 2006/0138470 A1 | 6/2006 | Han |
| 2006/0180885 A1 | 8/2006 | Rhodes |
| 2007/0148811 A1 | 6/2007 | Han |
| 2007/0272981 A1 | 11/2007 | Ha |
| 2008/0018334 A1 | 1/2008 | Reiderman |
| 2008/0067557 A1 | 3/2008 | Yu et al. |

* cited by examiner

600

700

US 8,859,352 B2

LIGHTLY-DOPED DRAINS (LDD) OF IMAGE SENSOR TRANSISTORS USING SELECTIVE EPITAXY

REFERENCE TO RELATED APPLICATIONS

This application is a divisional of U.S. application Ser. No. 12/274,275, filed Nov. 19, 2008, now pending. U.S. application Ser. No. 12/274,275 is hereby incorporated by reference.

BACKGROUND

1. Field

Embodiments of the present invention relate to image sensors and in particular, to lightly-doped drain (LDD) implants in image sensor transistors.

2. Discussion of Related Art

A conventional image sensor, which may be fabricated using a complementary metal oxide semiconductor (CMOS) technology or charge coupled device (CCD) technology, includes an array of pixels and associated readout circuitry. The pixel of a typical conventional CMOS image sensor may include a photosensitive element, a micro-lens, one or more light filters, a transfer transistor, a floating diffusion region, reset transistor, source follower, and a row select transistor.

The image sensor generally operates as follows. Light is incident on the micro-lens. The micro-lens focuses the light to the photosensitive element through the light filter. The photosensitive element converts the light into an electrical signal proportional to the intensity of the light detected. The transfer transistor is between the photosensitive element and the floating diffusion region and is used to transfer the electrical signal from the photosensitive element to the floating diffusion region. The electrical signal modulates the source follower. The reset transistor resets the photosensitive element. Keeping in mind that an image sensor typically includes an array of a large number of pixels, readout circuitry allows signals generated in the photosensitive elements to be processed into a usable image.

Conventional image sensors suffer from some limitations. As the pixel sizes of CMOS image sensors become smaller, for a greater density of pixels and lower cost, the active area of the photosensitive element becomes smaller. The smaller photosensitive element area can lead to lower sensitivity. If the photosensitive element has a relatively low sensitivity, the photosensitive element may not collect enough light. The result is that the reproduced image can be too dark and noisy. The smaller photosensitive element area also can lead to smaller full well capacity, which is the number of charges that can be held in the photosensitive element before it saturates.

Low sensitivity and reduced full well capacity can in turn lead to lower dynamic range and lower signal-to-noise ratio. Dynamic range is a measure of the photosensitive element's ability to adequately render both dark shadows and light in a scene.

One conventional method utilized to increase the area of the photosensitive element is to have multiple photosensitive elements share pixel transistors, such as the source follower, reset transistor, and row select transistor. For example, two combinations of photosensitive elements, transfer transistors, and floating diffusion regions can share one set of pixel transistors. Alternatively, four combinations of photosensitive elements, transfer transistors, and floating diffusion regions can share one set of pixel transistors. However, even with sharing, the pixel transistors still take up sizable space of the limited device area. For example, a 4-pixel-shared architecture may include 1.75 transistors per pixel. Alternatively, a 2-pixel-shared architecture may include 2.5 transistors per pixel.

Also, because the bias swings on the pixel transistors are high, the pixel transistors should be well isolated from each other and from the photosensitive elements. Shallow trench isolation (STI) typically performs this function.

Some conventional pixel transistors also have lightly-doped drain (LDD) source/drain implants. To account for process variations of the LDD implant photoresist pattern for both size and overlay, a minimum distance between the edge of the LDD defined by mask and photoresist and the pixel transistor source or drain should be maintained. A minimum distance should also be maintained between the photosensitive element and the LDD edge in order to prevent increased dark current and white pixels. If the design rules associated with these minimum distances are not adhered to, areas that should be implanted might not be implanted and areas that should not be implanted might accidentally be implanted. As a result of the design rules, the isolation distance between the photosensitive element and the source/drain of the pixel transistors may not be able to be made as small as desired.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, wherein.

DETAILED DESCRIPTION OF EMBODIMENTS

According to embodiments of the present invention, an image sensor comprises an array of pixels including pixel transistors disposed in or on a semiconductor, e.g., silicon, substrate. In a departure from conventional methods, instead of having LDD regions of the pixel transistors implanted with silicon dopants using a mask, doped silicon may be epitaxially grown in the LDD regions to appropriately dope the LDD regions. Alternatively, a doped sacrificial blanket film may be used to form LDD regions by diffusing the dopants from the film into the LDD regions. If peripheral transistors are disposed on the substrate, a protective oxide is disposed on the peripheral transistors to prevent silicon from being grown on the peripheral transistors during the epitaxial growth process.

For some embodiments, the doped silicon may be n-doped silicon. For other embodiments, the doped silicon may be p-doped silicon.

There are advantages to forming the LDD areas using epitaxial growth rather than conventional implantation. For example, because the LDD implant mask is eliminated the design rules associated with the minimum distance between the edge of the LDD implant mask and the pixel transistor source or drain no longer applies. Additionally, the design rule associated with the minimum distance between the LDD implant mask and the photosensitive element no longer applies. As a result, the isolation distance between the photosensitive element and the pixel transistor may be made smaller to the extent that other rules may limit.

The smaller isolation region width between the photosensitive element and the pixel transistor source or drain may have advantages. For example, for some embodiments, the pixels may have the same pitch as those normally found in a particular CMOS fabrication technology, e.g., 0.13 micron CMOS technology (as well as larger or smaller), even though the photosensitive elements in the pixels are larger than the photosensitive elements normally found in that fabrication technology. For other embodiments, the pixels may have a different pitch than those normally found in a particular CMOS fabrication technology even though the photosensitive elements in the pixels are the same size as the photosensitive elements normally found in that particular fabrication technology. Other features and advantages will be readily apparent after reading the description herein.

Figure 1:
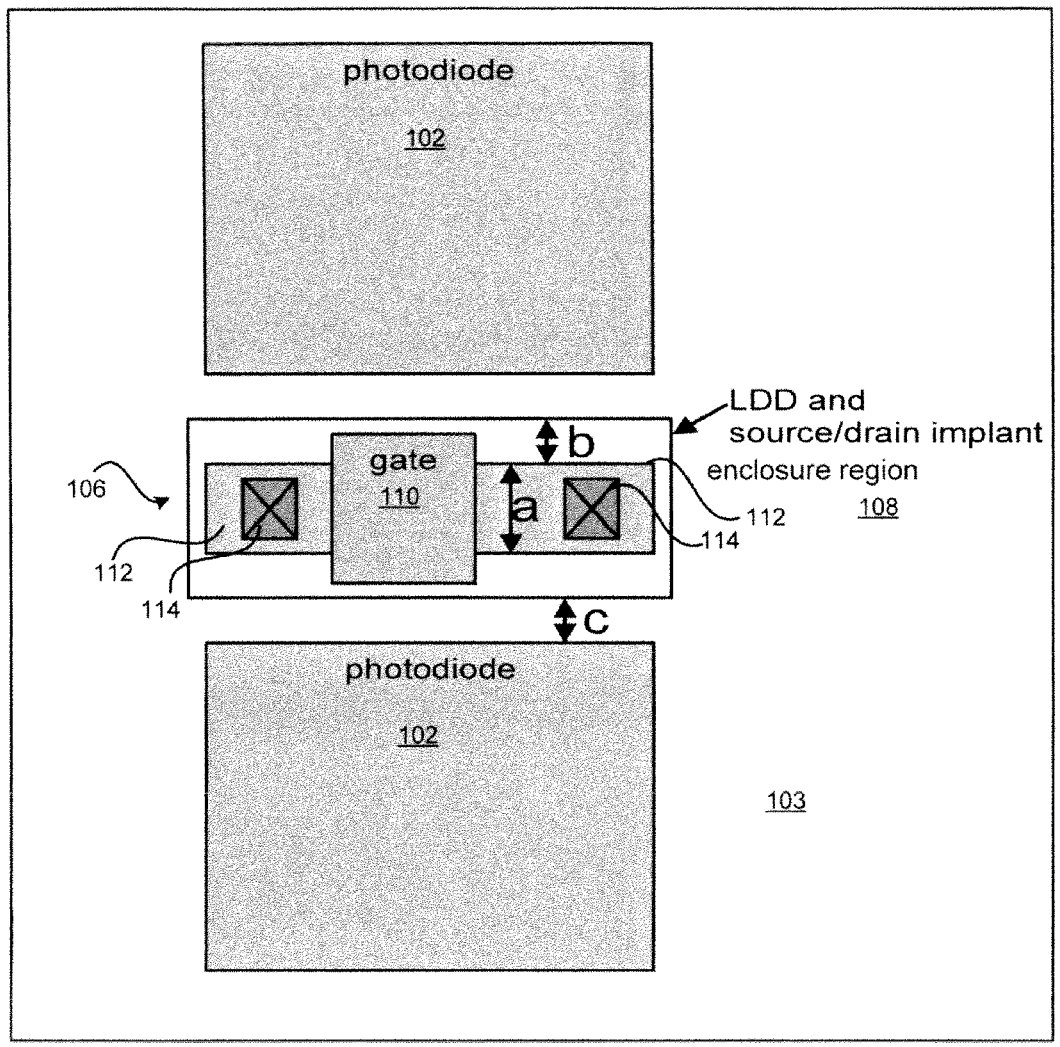
FIG. 1 is a top view of a portion of an image sensor according to an embodiment of the present invention. Restrictions on design rule imposed by LDD implantation in a conventional image sensor is also shown in this figure for illustration purposes.

FIG. 1 is a top view of a portion of an image sensor 100 according to an embodiment of the present invention. In the illustrated embodiment, two photosensitive elements, labeled photodiodes 102, are disposed on a substrate 103. A pixel transistor 106 also is disposed on the substrate 103. In a shared pixel arrangement, both of the photodiodes 102 may share the pixel transistor 106. Alternatively, the pixel transistor 106 may be coupled to only one of the photodiodes 102.

The illustrated pixel transistor 106 includes a gate 110, two source/drain regions 112 coupled to the gate 110, and two source/drain contacts 114 coupled to the two source/drain regions 112. An LDD implant mask opening 108 that exists in a conventional image sensor is also shown to show the limitations of a conventional image sensor. A dimension "b" represents the minimum distance between the edge of the LDD implant mask 108 and the source/drain regions 112 of the pixel transistor 106 to account for process variations of the implant mask photoresist pattern for both size and overlay. A dimension "c" represents the minimum distance between the LDD implant mask 108 of the pixel transistor 106 and the photosensitive element 102 that should be maintained to keep a safe distance of LDD implants from the photosensitive element 102 in order to prevent increased dark current and white pixels.

According to embodiments of the present invention, restrictions on dimensions "b" and "c" may not apply anymore because no mask is used to implant dopants in the LDD regions 112. The elimination of the restrictions due to the LDD implant mask on dimensions "b" and "c" allows the further minimization of the isolation region width between the photodiode 102 and the source/drain regions 112 of the pixel transistor 106. In some embodiments, this minimum isolation region width may be governed by the minimum achievable STI width for the CMOS technology in use. The elimination of the restrictions due to the LDD implant mask on dimensions "b" and "c" allows the pixel transistor 106 to be closer to the photodiode 102 than is possible with the conventional CMOS process. Alternatively, the elimination of the restrictions due to the LDD implant mask on dimensions "b" and "c" allows for a larger the photodiode 102 than is possible with the conventional CMOS process.

Figure 2:
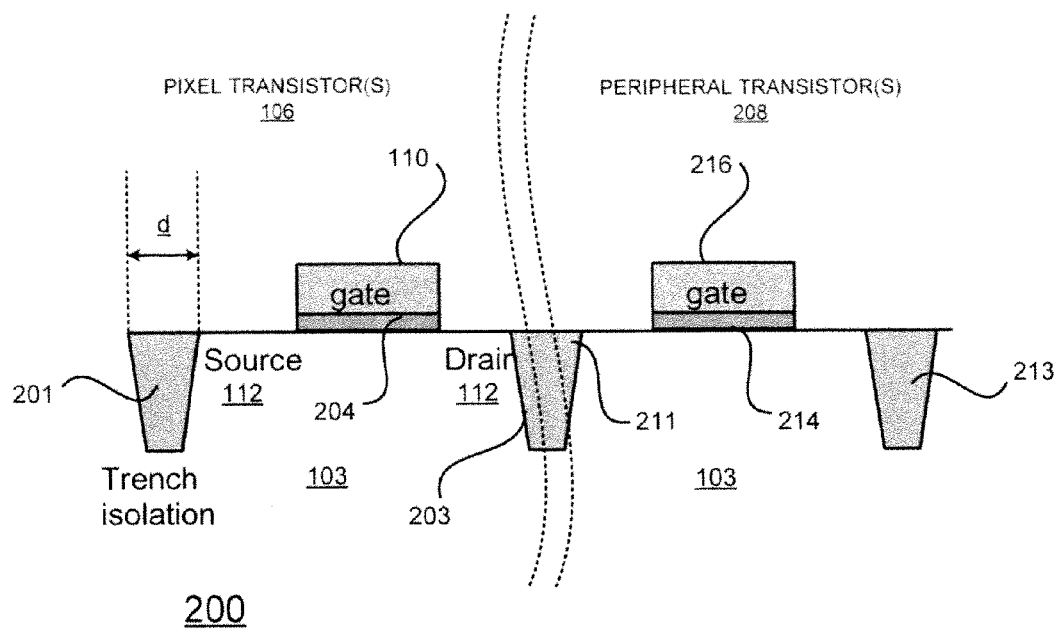
FIGS. 2 through 5 show alternative views of the image sensor depicted in FIG. 1 to illustrate a method of fabricating the image sensor depicted in FIG. 1 according to an embodiment of the present invention.

FIGS. 2 through 5 show alternative views of the image sensor 100 in order to illustrate a method of fabricating the image sensor 100 according to an embodiment of the present invention. The image sensor 100 as depicted in FIG. 2 shows two separate portions.

One portion includes one or more pixel transistors 106 disposed on the substrate 103, although only a single pixel transistor 106 is shown. The pixel transistor 106 includes the two source/drain regions 112, bounded by two shallow trench isolations 201 and 203. A gate oxide 204 is disposed on the substrate 103 and the gate 110 is disposed on the gate oxide 204. The pixel transistor 106 may be a source follower, a reset transistor, a row select transistor, a transfer transistor, etc., for example. Disposed on another portion of the image sensor 100 are one or more peripheral transistors 208, although only one peripheral transistor 208 is shown. The peripheral transistor 208 also is bounded by two shallow trench isolations 211 and 213. A gate oxide 214 is disposed on the substrate 103 and a gate 216 is disposed on the gate oxide 214. The peripheral transistor 208 may be any transistor other than a pixel transistor.

According to embodiments of the present invention, the elimination of the restrictions due to the LDD implant mask on dimensions "b" and "c" allows the minimization of the isolation region width between the photodiode 102 and the source/drain regions of the pixel transistor 106. In some embodiments this minimum isolation region width may be governed by the minimum achievable STI width for the CMOS technology in use.

Figure 3:
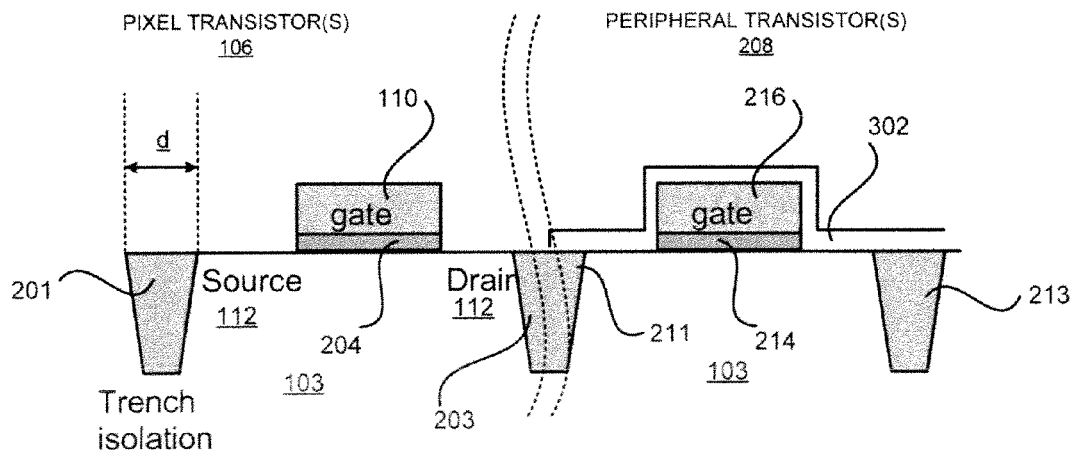
Figure 4:
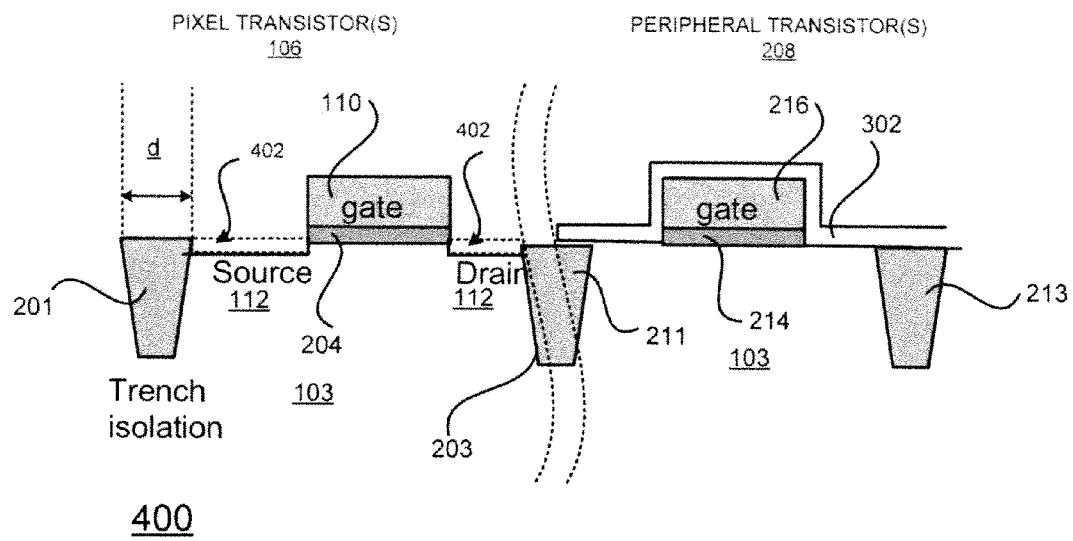
Figure 5:
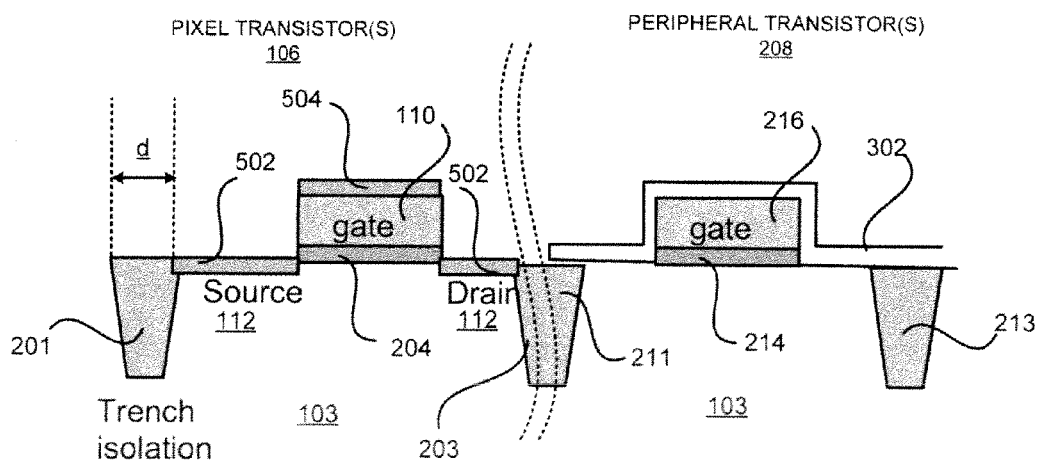

FIGS. 3 through 5 illustrate how the minimum achievable STI width in the absence of restrictions due to the LDD implant mask is achieved. In FIG. 3, the pixel transistor 106 and the peripheral transistor 208 are shown. According to embodiments of the present invention, to fabricate the image sensor 100 devices such as the pixel transistors 106 and the peripheral transistors 208, normal CMOS image sensor processing up to the LDD formation stage is performed. Next, a protective oxide 302 is disposed on the image sensor 100 and photolithography and etching may be used to remove the protective oxide 302 from over and around the pixel transistor 106. As FIG. 3 illustrates, the protective oxide 302 remains on the peripheral transistor 208. For some embodiments, the protective oxide 302 may be an oxynitride or other suitable protective coating.

FIG. 4 shows the image sensor 100 as illustrated in FIG. 3 but in which recesses 402 are disposed in the source/drain regions 112 of the pixel transistor 106 according to an embodiment of the present invention. For some embodiments, a silicon dry etch may be performed to remove several nanometers to several tens of nanometers of silicon from the source/drain regions 112 of the pixel transistors 106.

FIG. 5 shows the image sensor 100 as illustrated in FIG. 4 but in which doped silicon 502 is disposed in the recesses 402 of the pixel transistor 106 according to an embodiment of the present invention to form LDD-type source drain areas 112. For some embodiments, selective n-type silicon epitaxy is performed to form LDD areas 112. The epitaxy is selective because the doped silicon 502 epitaxially grows on the exposed silicon of the pixel transistors 106 but not on the areas of the peripheral transistors 208 protected by the oxide 302. According to some embodiments, the silicon 502 used for epitaxial growth may be doped during deposition by adding n-type or p-type dopants to the source gas.

Although not shown in FIG. 5, at the end of the selective epitaxy process, the top surface of the doped silicon 502 may be at or below the interface between the gate oxide 204 and the silicon substrate 103. This may ensure good isolation between the LDD areas 112 and gate electrode 110.

After selective epitaxy is performed, normal CMOS image sensor process flow may be performed to continue fabrication of the image sensor 100. For some embodiments, the protective oxide 302 can be removed right after the selective epitaxy process. Alternatively, the protective oxide 302 can be removed during the spacer formation process that is performed later in the fabrication process.

Note that after the selective epitaxy process there may be epitaxial silicon growth 504 on the surface of the gate 110. The epitaxial silicon growth 504 can be prevented by leaving the protective oxide 302 on the gate 110.

Figures 6, 7:
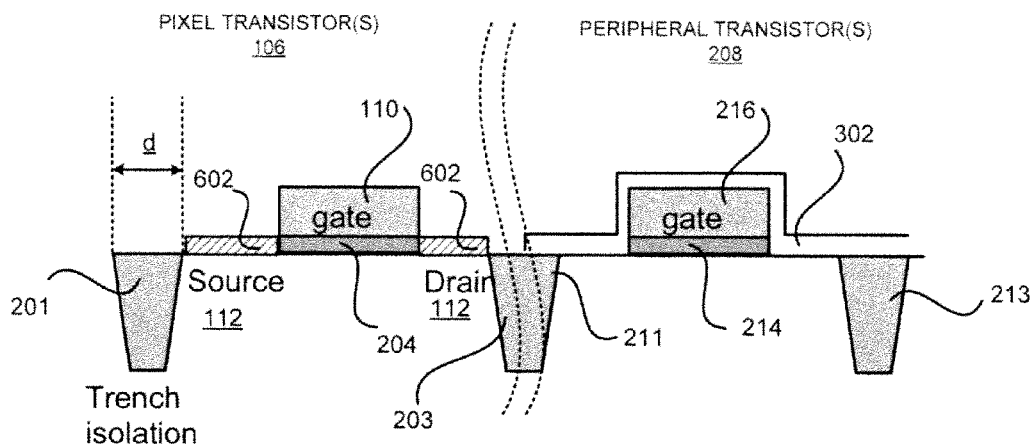
FIG. 6 shows the image sensor fabricated according to an alternative embodiment of the present invention.
FIG. 7 shows the image sensor depicted in FIG. 6 in which the dopant has been diffused into the substrate to form LDD areas according to an embodiment of the present invention.

An alternative approach to forming the LDD regions 112 is to selectively grow doped epitaxial silicon after disposing the protective oxide 302 and without the using the recesses 402. FIG. 6 shows the image sensor 100 as illustrated in FIG. 3 but in which doped silicon 602 is epitaxially grown on the surface of the substrate 103 according to an embodiment of the present invention. In the illustrated embodiment, the doped silicon 602 is disposed in proximity to the source/drain regions 112. For some embodiments, a thermal anneal step can be performed to diffuse the doped silicon 602 into the substrate 103 to form the LDD areas 112.

FIG. 7 shows the image sensor 100 as illustrated in FIG. 6 in which the doped silicon 602 has been diffused into the substrate 103 to form LDD areas 702. After the doped silicon 602 has been diffused into the substrate 103 the epitaxially grown doped silicon 602 may then be etched away from the surface of the substrate 103. The benefit of this approach is that no etch step is required to form the recesses 402 (see FIG. 4) in the substrate 103 and therefore no damage to substrate 103 is caused by etching the recesses 402. Also, in this embodiment, the quality of the epitaxial film having the doped silicon 602 is not as critical as the epitaxial film having the doped silicon 502 because the doped silicon 602 is sacrificial and serves only as dopant carrier.

Alternatively still, a doped sacrificial blanket film may be used to form the LDD regions 112 according to an embodiment of the present invention. In the embodiment illustrated in FIG. 8, a doped sacrificial blanket film 802 is disposed on the surface of substrate 103, the protective oxide 302, the gate 110, and optionally the trench isolation 201. For some embodiments, the film 802 may be disposed using chemical vapor deposition (CVD) or other suitable technique. The film 802 may be any sacrificial dopant carrier material. For some embodiments, the film 802 may be a doped glass source, such as an oxide. For other embodiments, the film 802 may be a doped non-selective epitaxial film in that the film 802 may grow epitaxially on exposed silicon and also be deposited non-epitaxially onto non-silicon surfaces. The dopant may be a p-type dopant or an n-type dopant.

Figure 8:
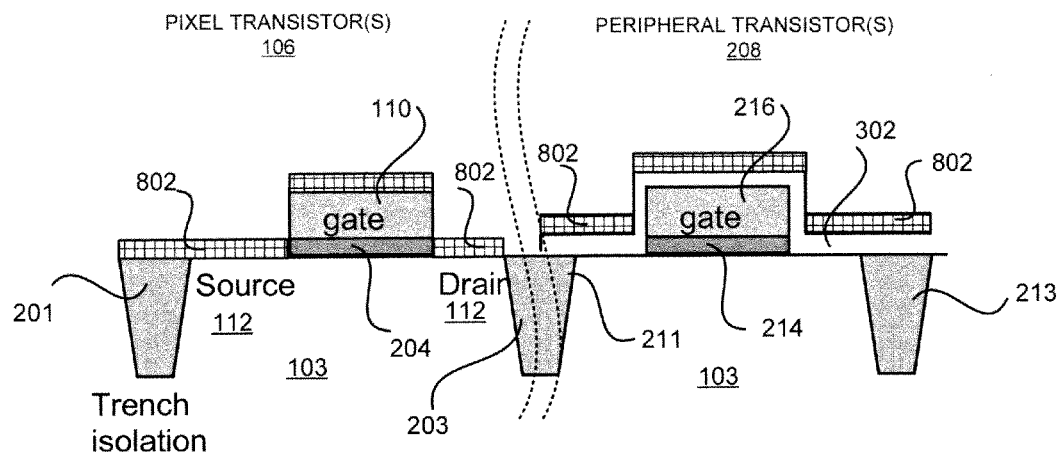
FIG. 8 shows an image sensor in which a doped sacrificial blanket film may be used to form LDD regions according to an embodiment of the present invention.
Figure 9:
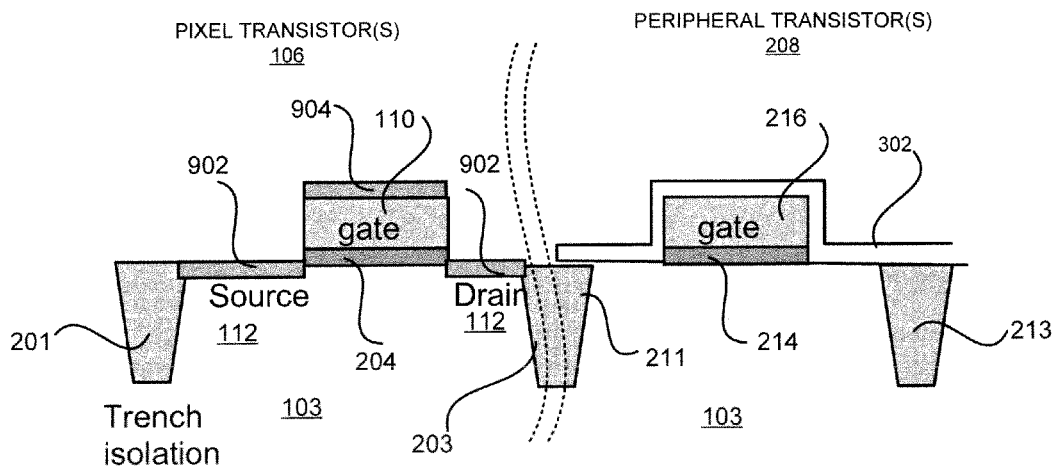
FIG. 9 shows the image sensor depicted in FIG. 8 in which the dopant has been diffused into the substrate to form LDD areas according to an embodiment of the present invention.

For some embodiments, a thermal anneal step can be performed to diffuse the dopants from the film 802 into the substrate 103 to form the LDD areas 112. Following anneal and diffusion of dopants into the substrate, the film 802 may be removed, such as by stripping/etching, leaving the dopants in the LDD areas 112. FIG. 9 shows the image sensor 100 as illustrated in FIG. 8 in which the film 802 has been diffused into the substrate 103 to form LDD areas 902 and the film 802 removed from the surface of the substrate 103, the gate 110, and the trench isolation 201. There may be an artifact 904 on the surface of the gate 110.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the method and processes herein. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations have not been shown or described in detail to avoid obscuring the understanding of the description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. A method, comprising:
   disposing a protective oxide material on at least one peripheral transistor disposed in or on a silicon substrate, wherein the peripheral transistor includes a first gate electrode and a first dielectric layer that is disposed between the first gate electrode and the silicon substrate, and wherein the first dielectric layer is disposed on a first portion of the silicon substrate that is of a first conductivitiy type; and then
   epitaxially growing silicon of a second conductivity type for a lightly-doped drain (LDD) area of at least one pixel transistor disposed in or on the silicon substrate, such that the LDD is disposed adjoining a second dielectric layer of the pixel transistor, wherein the second dielectric layer is disposed:
      between a second gate electrode of the pixel transistor and the silicon substrate, and
      on a second portion of the silicon substrate that is of the first conductivity type;
   wherein the protective oxide material prevents the growth of silicon in the peripheral transistor during the epitaxially growing of silicon.

2. The method of claim 1, further comprising epitaxially growing silicon in a recess in the silicon substrate for the LDD area of the at least one pixel transistor.

3. The method of claim 2, wherein the at least one pixel transistor comprises a transistor selected from at least one of a source follower, a reset transistor, a row select transistor, and a transfer transistor.

4. The method of claim 2, wherein epitaxially growing silicon in the recess comprises epitaxially growing n-doped silicon in the recess.

5. The method of claim 2, wherein epitaxially growing silicon in the recess comprises epitaxially growing p-doped silicon in the recess.

6. The method of claim 1, further comprising epitaxially growing silicon on a surface of the silicon substrate in proximity to the LDD area of the at least one pixel transistor.

7. The method of claim 6, further comprising:
annealing the epitaxially grown silicon;
diffusing the dopant within the epitaxially grown silicon from the surface of the silicon substrate into the LDD area of the silicon substrate of the at least one pixel transistor; and
removing the epitaxially grown silicon from the surface of the silicon substrate.

8. The method of claim 7, wherein the at least one pixel transistor comprises a transistor selected from at least one of a source follower, a reset transistor, a row select transistor, and a transfer transistor.

9. The method of claim 7, wherein epitaxially growing silicon on the surface of the silicon substrate in proximity to the LDD area comprises epitaxially growing n-doped silicon surface on the silicon substrate in proximity to the LDD area.

10. The method of claim 7, wherein epitaxially growing silicon on the surface of the silicon substrate in proximity to the LDD area comprises epitaxially growing p-doped silicon on the surface of the silicon substrate in proximity to the LDD area.

11. A method, comprising:
disposing a protective oxide material on at least one peripheral transistor disposed in or on a silicon substrate, wherein the peripheral transistor includes a first gate electrode and a first dielectric layer that is disposed between the first gate electrode and the silicon substrate, and wherein the first dielectric layer is disposed on a first portion of the silicon substrate that is of a first conductivitiy type;
disposing a dopant carrier on the at least one peripheral transistor and a lightly-doped drain (LDD) area of at least one pixel transistor disposed in or on the silicon substrate and adjoining a second dielectric layer of the pixel transistor, wherein the second dielectric layer is disposed:
between a second gate electrode of the pixel transistor and the silicon substrate, and
on a second portion of the silicon substrate that is of the first conductivity type;
diffusing dopant of a second conductivity type from the dopant carrier into the LDD area of the at least one pixel transistor, wherein the protective oxide material prevents the formation of an LDD area in the peripheral transistor during the diffusing of dopant; and
removing the dopant carrier from the at least one peripheral transistor and the LDD area of the at least one pixel transistor.

12. The method of claim 11, wherein the dopant carrier comprises n-doped silicon.

13. The method of claim 11, wherein the dopant carrier comprises p-doped silicon.

14. The method of claim 11, wherein the dopant carrier comprises a doped glass.

15. The method of claim 11, wherein the dopant carrier comprises an oxide.

* * * * *